United States Patent
Effing

(10) Patent No.: US 10,833,500 B2
(45) Date of Patent: Nov. 10, 2020

(54) THERMAL PROTECTION OF SMPS SWITCH

(71) Applicant: NXP B.V., Eindhoven (NL)

(72) Inventor: Hermanus Johannes Effing, Overasselt (NL)

(73) Assignee: NXP B.V., Eindhoven (NL)

(*) Notice: Subject to any disclaimer, the term of this patent is extended or adjusted under 35 U.S.C. 154(b) by 401 days.

(21) Appl. No.: 15/966,557

(22) Filed: Apr. 30, 2018

(65) Prior Publication Data
US 2019/0334341 A1 Oct. 31, 2019

(51) Int. Cl.
*H02H 5/00* (2006.01)
*H02H 5/04* (2006.01)
*H02H 7/12* (2006.01)
*H02M 1/32* (2007.01)

(52) U.S. Cl.
CPC .......... *H02H 5/042* (2013.01); *H02H 7/1203* (2013.01); *H02M 1/32* (2013.01); *H02M 2001/327* (2013.01)

(58) Field of Classification Search
None
See application file for complete search history.

(56) References Cited

U.S. PATENT DOCUMENTS

| | | | | |
|---|---|---|---|---|
| 4,250,829 A | * | 2/1981 | Stephens, Jr. | ...... G01N 33/0065 123/198 D |
| 4,335,703 A | * | 6/1982 | Klank | ...................... F24B 1/187 126/502 |
| 7,285,964 B1 | * | 10/2007 | Hsu | ......................... G01D 21/02 324/602 |
| 9,184,666 B2 | | 11/2015 | Sood et al. | |
| 2004/0227545 A1 | | 11/2004 | Nadd et al. | |
| 2006/0028257 A1 | * | 2/2006 | Huang | ............... H03K 17/0822 327/175 |
| 2011/0298374 A1 | | 12/2011 | Lenk et al. | |
| 2017/0201251 A1 | | 7/2017 | Chandrasekaran et al. | |

FOREIGN PATENT DOCUMENTS

JP 2000-356976 A 12/2000

* cited by examiner

*Primary Examiner* — Stephen W Jackson
(74) *Attorney, Agent, or Firm* — Rajeev Madnawat

(57) ABSTRACT

A circuit for measuring temperature of an external switch is disclosed. The circuit includes a variable resistor, a switch coupled to the variable resistor in series, a fixed value resistor coupled to the variable resistor and a comparator coupled between the variable resistor and the fixed value resistor. The circuit is configured to compare voltage drop between a drain and a source of the external switch when the external switch is in ON state with voltage drop at the variable resistor and output a signal to indicate an overtemperature based on the comparing.

8 Claims, 1 Drawing Sheet

THERMAL PROTECTION OF SMPS SWITCH

BACKGROUND

Power supplies are used virtually in every electronic device primarily for converting alternate current (AC) or direct current (DC) electrical input that may vary in voltage due to power line conditions and load factors, into a constant direct current (DC) output voltage to power the internal circuitry of the electronic device.

Power supplies designed to convert a fluctuating input voltage to a constant, lower, output voltage can be realized by a linear converter. However, such linear power supplies are characterized by poor efficiency. If a linear power supply is used for delivering larger output current or power, the efficiency becomes detrimentally prominent.

A switched mode power supply (SMPS) is often used when a greater efficiency is desired. The SMPS includes a power switch that is a key element of any SMPS. The power switch may be damaged if overheated.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a circuit for measuring temperature of an external switch is disclosed. The circuit includes a variable resistor, a switch coupled to the variable resistor in series, a fixed value resistor coupled to the variable resistor and a comparator coupled between the variable resistor and the fixed value resistor. The circuit is configured to compare voltage drop between a drain and a source of the external switch when the external switch is in ON state with voltage drop at the variable resistor and output a signal to indicate an overtemperature based on the comparing.

In some examples, the switch is configured to turn on only when the external switch is turned on and the switch is turned on via a drive signal that drives a gate of the external switch. The drive signal is coupled to the switch via a delay circuit. The delay circuit introduces a predetermined delay based on saturation characteristics of the external switch. The comparator is configured to maintain an output until voltage difference at the comparator's inputs reverses. The variable resistor is configured to change a temperature threshold.

In one example, an integrated circuit is disclosed. The IC includes a circuit for measuring temperature of an external switch is disclosed. The circuit includes a variable resistor, a switch coupled to the variable resistor in series, a fixed value resistor coupled to the variable resistor and a comparator coupled between the variable resistor and the fixed value resistor. The circuit is configured to compare voltage drop between a drain and a source of the external switch when the external switch is in ON state with voltage drop at the variable resistor and output a signal to indicate an overtemperature based on the comparing. The IC also includes a port for receiving a drive signal for driving the switch, a port for outputting an overtemperature signal, a port for receiving an input from a drain of the external switch and a port for receiving an input from a source of the external switch.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in detail in the description so as not to obfuscate the present disclosure.

Figure 1:
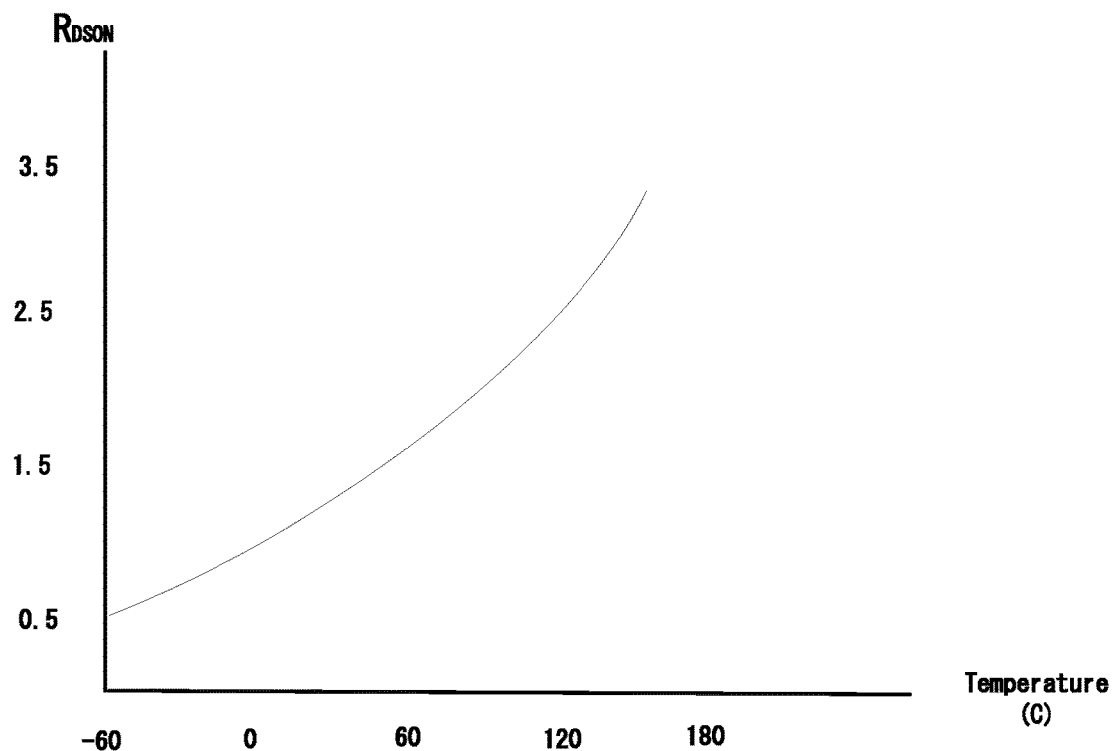
FIG. 1 depicts a graph to show a relationship between the on resistance of a switch and the temperature.

A transistor's ON state resistance ($R_{DS(on)}$) is the resistance between its drain and source during ON state. As illustrated in FIG. 1, $R_{DS(on)}$ varies with changes in temperature. Therefore, a transistor's temperature can be, at least roughly, measured by measuring $R_{DS(on)}$.

Measuring the switching transistor of a switch mode power supply (SMPS) is important to protect the switching transistor from being damaged due to overheating. The SMPS may be designed to change switching frequency or put the SMPS in bypass mode by turning off the switching based on temperature measurements. Embodiments described herein use $R_{DS(on)}$ to measure the temperature and outputs a signal when the temperature exceeds a preselected threshold.

Figure 2:
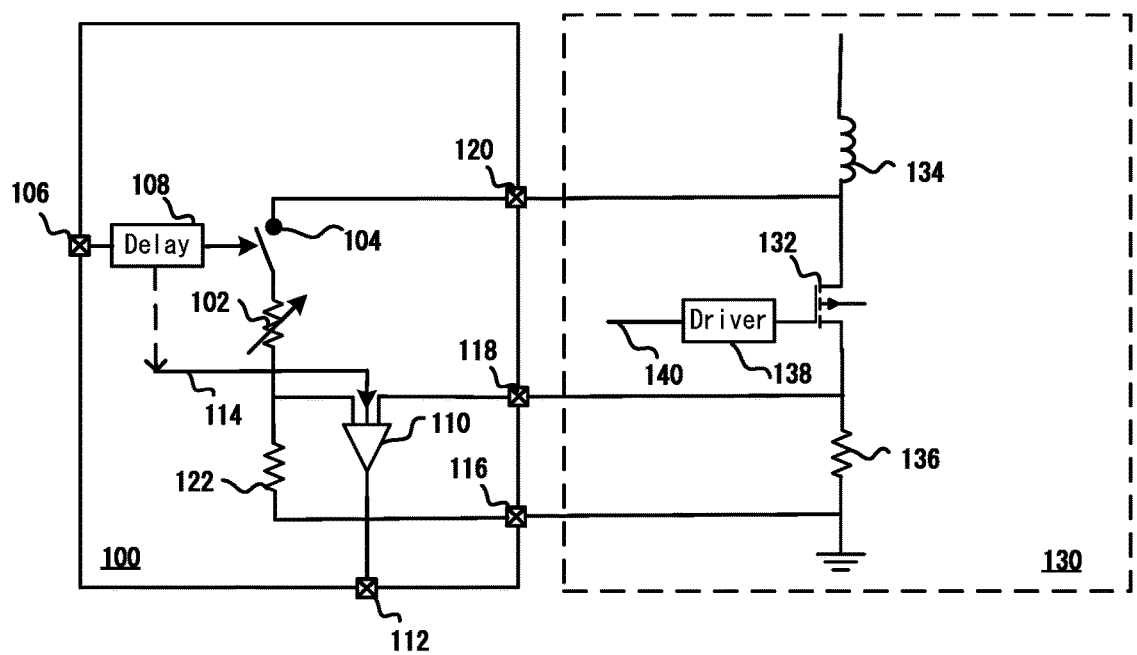
FIG. 2 depicts a schematic diagram of a switch mode power supply (SMPS) switch protection circuit in accordance with one or more embodiments of the present disclosure.

FIG. 2 a schematic diagram of a SMPS switch protection circuit 100 and a partial schematic of a SMPS 130. It should be noted only a few components that are necessary to describe the embodiments of the present disclosure are being shown, so as not to obfuscate the present disclosure. The full circuit of the SMPS 130 is well known to a person skilled in the art. Typically, the SMPS 130 includes a power switch 132, an inductor 134 and a resistor 136. A driver circuit 138 is included to turn the power switch 132 ON or OFF using a pulse of a preselected fixed or variable frequency.

In some embodiments, the SMPS switch protection circuit 100 may be an independent integrated circuit having pins 106, 112, 116, 118 and 120. Pin 106 is for receiving input from the same signal source 140 that is also used by the switching driver 138 that drives the gate of the power switch 132. Pin 112 is for outputting over temperature signal. Pins 116, 118, 120 are configured to be coupled to the power switch 132, the resistor 136 and the inductor 134. In other embodiments, the circuit 100 may be incorporated in the SMPS 130 itself. In some examples, the SMPS switch protection circuit 100 may be fabricated in the same silicon wafer near the driver 138 of the SMPS 120.

A delay block 108 is included to delay the power switch 132 switching pulse by a preselected time. The switching pulse is delayed to allow the power switch 132 reach a saturation state after being turned on before the switch 104 is turned on. In some embodiments, the delay may be preset based on the saturation characteristics of the power switch 132. A variable resistor 102 is included to set a preset temperature threshold above which an overtemperature signal should be outputted by a comparator 110. The variable resistor 102 may be coupled to an input that can be used to change the temperature threshold above which the overtemperature signal is triggered. The variable resistor 102, a fixed resistor 122 and components such as the resistor 136, the power switch 132 and the inductor 134 creates a Wheatstone bridge.

When the power switch 132 is turned ON, after a preset delay, the switch 104 is turned on. The comparator 102 compares the voltage divided by $R_{DS(on)}$ and the resistor 136 on one side and the voltage divided by the variable resistor 102 and the resistor 122. The comparator 102 may also include a latch signal 114 to allow maintaining the same output at the output of the comparator 102 until the input voltages at the input of the comparator 102 reverse. In some embodiments, the latch signal 114 may be derived from the delay block 108. When $R_{DS(on)}$ of the power switch 132 increases due to increase in temperature, the voltage at the pin 118 drops, causing the comparator 102 to produce the overtemperature signal.

The overtemperature signal may be used by the SMPS 120 to reduce the switching frequency or the duty cycle or the switching pulse of the signal that drives the power switch 132. In some embodiments, the switching of the power switch 132 may be terminated and the SMPS is put in the bypass mode when the overtemperature signal is produced.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A circuit for measuring temperature of an external switch, the circuit comprising:
   a variable resistor;
   a switch coupled to the variable resistor in series;
   a fixed value resistor coupled to the variable resistor; and
   a comparator coupled between the variable resistor and the fixed value resistor;
   wherein the circuit is configured to compare voltage drop between a drain and a source of the external switch when the external switch is in ON state with voltage drop at the variable resistor and output a signal to indicate an overtemperature based on the comparing.

2. The circuit of claim 1, wherein the switch is configured to be turned on only when the external switch is turned on.

3. The circuit of claim 2, wherein the switch is configured to be turned on via a drive signal that drives a gate of the external switch.

4. The circuit of claim 3, wherein the drive signal is coupled to the switch via a delay circuit.

5. The circuit of claim 4, wherein the delay circuit is configured to introduce a predetermined delay based on saturation characteristics of the external switch.

6. The circuit of claim 1, wherein the comparator is configured to maintain an output until voltage difference at the comparator's inputs reverses.

7. The circuit of claim 1, wherein the variable resistor is configured to change a temperature threshold.

8. An integrated circuit, comprising:
   a port for receiving a drive signal for driving the switch;
   a port for outputting an overtemperature signal;
   a port for receiving an input from a drain of the external switch;
   a port for receiving an input from a source of the external switch
   a circuit for measuring temperature of an external switch, wherein the circuit includes:
      a variable resistor;
      a switch coupled to the variable resistor in series;
      a fixed value resistor coupled to the variable resistor; and
      a comparator coupled between the variable resistor and the fixed value resistor;
      wherein the circuit is configured to compare voltage drop between a drain and a source of the external switch when the external switch is in ON state with voltage drop at the variable resistor and output a signal to indicate an overtemperature based on the comparing.

\* \* \* \* \*